(12) United States Patent
Chi et al.

(10) Patent No.: US 8,946,036 B2
(45) Date of Patent: Feb. 3, 2015

(54) METHOD OF FORMING DIELECTRIC FILMS USING A PLURALITY OF OXIDATION GASES

(71) Applicant: Taiwan Semiconductor Manufacturing Company, Ltd., Hsin-Chu (TW)

(72) Inventors: Liang-Chen Chi, Hsin-Chu (TW); Chia-Ming Tsai, Zhubei (TW); Yu-Min Chang, Hsin-Chu (TW); Chin-Kun Wang, Hsin-Chu (TW); Miin-Jang Cheng, Taipei (TW); Keng-Ham Lin, Guishan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/708,409

(22) Filed: Dec. 7, 2012

(65) Prior Publication Data

US 2014/0162425 A1    Jun. 12, 2014

(51) Int. Cl.
*H01L 21/336* (2006.01)
*H01L 21/02* (2006.01)
*C23C 16/455* (2006.01)

(52) U.S. Cl.
CPC .... *H01L 21/02263* (2013.01); *H01L 21/02148* (2013.01); *H01L 21/0228* (2013.01); *C23C 16/45527* (2013.01)
USPC .......................................... 438/303; 438/778

(58) Field of Classification Search
USPC .................. 438/303, 586; 257/288, 411, 761, 257/E29.255, E21.409, E21.19
See application file for complete search history.

(56) References Cited

U.S. PATENT DOCUMENTS

| | | | |
|---|---|---|---|
| 7,030,450 B2 * | 4/2006 | Lee et al. | 257/411 |
| 7,790,628 B2 * | 9/2010 | Clark et al. | 438/778 |
| 2012/0205727 A1 * | 8/2012 | Kanakasabapathy et al. | 257/288 |

OTHER PUBLICATIONS

Nyns et al., Atomic Layer Deposition: Nucleation and Growth Behavior of HfO2 Dielectrics on Semiconductor Surfaces, Jun. 2009, ISBN 978-90-8649-265-7 D/2009/10.705/43, pp. 1-198.*

* cited by examiner

*Primary Examiner* — Reema Patel
*Assistant Examiner* — Syed Gheyas
(74) *Attorney, Agent, or Firm* — Slater & Matsil, L.L.P.

(57) ABSTRACT

A method for forming a dielectric film is disclosed. The method includes (a) exposing a substrate to a first gas pulse having a first oxygen-containing gas in a chamber; (b) exposing the substrate to multiple consecutive second gas pulses having a second oxygen-containing gas in the chamber, wherein the first oxygen-containing gas is different from the second oxygen-containing gas; and (c) sequentially after (a) and (b), exposing the substrate to a third gas pulse having a metal-containing gas in the chamber. Steps (a), (b), and (c) may be repeated any number of times to form the dielectric film with a predetermined thickness.

20 Claims, 7 Drawing Sheets

METHOD OF FORMING DIELECTRIC FILMS USING A PLURALITY OF OXIDATION GASES

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component that can be created using a fabrication process) has decreased. With decreasing feature sizes, quantum mechanical tunneling ("tunneling") leads to leakage current, i.e., current leaking out of device features (e.g., across gate oxides), which adversely affects device performance. For this reason, a thin $SiO_2$ film, which is traditionally used as a gate oxide in metal-oxide-semiconductor field effect transistors (MOSFETs), can no longer function as an effective gate dielectric. Thus, an ultra-thin dielectric film with a high dielectric constant ("high-k dielectric") is desirable.

To form a thin dielectric film on a substrate, a variety of deposition techniques have been developed. For example, chemical vapor deposition (CVD) has traditionally been used to form a high-k film on a substrate. In gate dielectric applications, electrically active defects should be minimized or prevented from forming at the interface between a substrate and a high-k dielectric. Thus, another method known as atomic layer deposition (ALD) has been developed for depositing a high-k film onto a substrate. However, further developments for forming high-k dielectrics are still needed to solve some problems of prior approaches.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
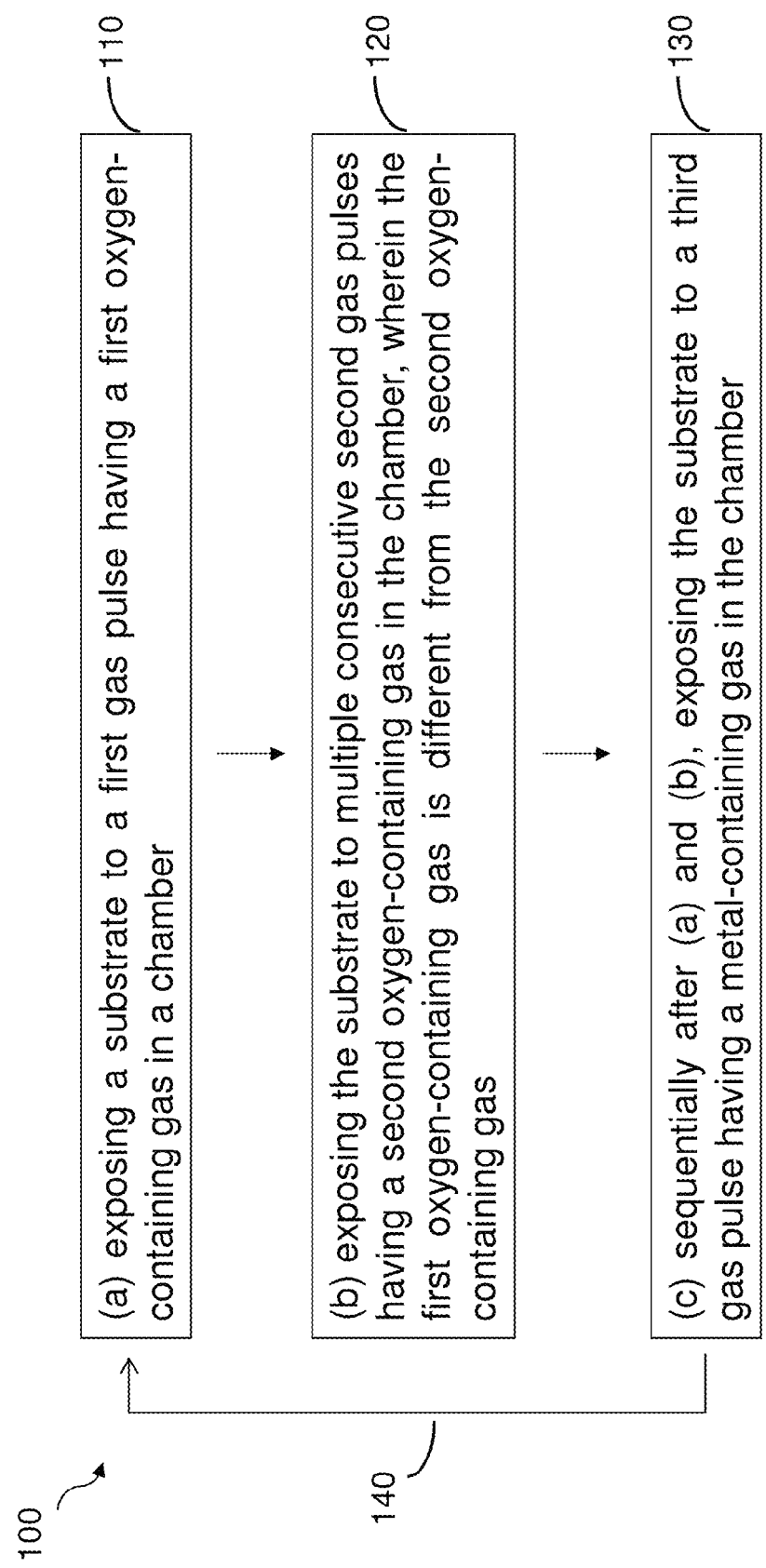
FIG. 1 is a process flow chart of a method of forming a dielectric film according to various aspects of the present disclosure.

The present invention relates generally to the field of forming dielectric films for semiconductor manufacturing, and more particularly to methods of forming high-k films by atomic layer deposition (ALD) or chemical vapor deposition (CVD).

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature "over" or "on" a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

There is a need for new methods that provide flexibility for depositing dielectric films with tailored material and electrical properties for advanced semiconductor devices. ALD can be used to deposit a wide variety of high-k materials such as oxides, silicates, and oxynitrides for fabrication of advanced ICs. A high-k material deposited by ALD can be used as a gate dielectric film in MOSFETs. ALD is a self-limiting (the amount of film material deposited in each reaction cycle is constant), sequential surface chemistry that deposits conformal thin films of materials onto substrates of varying compositions. Due to the characteristics of self-limiting and surface reactions, ALD film growth makes atomic scale deposition control possible. ALD is similar in chemistry to chemical vapor deposition (CVD), except that the ALD reaction breaks the CVD reaction into two half-reactions, keeping the precursor materials separate during the reaction. By keeping the precursors separate throughout the coating process, atomic layer control of film growth can be obtained as fine as 1 angstrom (Å) per cycle. Separation of the precursors is accomplished by pulsing a purge gas (typically nitrogen or argon) after each precursor pulse to remove excess precursor from the process chamber and prevent 'parasitic' deposition on the substrate.

FIG. 1 is a process flow chart of a method 100 of forming a dielectric film according to various aspects of the present disclosure. It is understood that additional steps can be provided before, during, and after the method 100, and some of the steps described can be replaced or eliminated for other embodiments of the method. The method 100 begins at step 110 in which a substrate is exposed to a first gas pulse having a first oxygen-containing gas in a chamber. The method 100 continues with step 120 in which the substrate is exposed to multiple consecutive second gas pulses having a second oxygen-containing gas in the chamber, wherein the first oxygen-containing gas is different from the second oxygen-containing gas. The method 100 continues with step 130 in which the substrate is exposed to a third gas pulse having a metal-containing gas in the chamber sequentially after steps 110 and 120. Steps 110, 120, and 130 may be repeated any number of times, as shown by step 140, to form the dielectric film with a predetermined thickness. For example, the predetermined thickness can be between about 5 angstrom (Å) and about 200 angstrom (Å), or between about 5 angstrom (Å) and about 30 angstrom (Å). The substrate may be a semiconductor substrate that includes an elementary semiconductor including silicon and/or germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the substrate may be a semiconductor on insulator (SOI). In some examples, the substrate may include a doped epi layer. In other examples, the silicon substrate may include a multilayer compound semiconductor structure. Alternatively, the first substrate may include a non-semiconductor material, such as a glass, fused quartz, or calcium fluoride. In the present example, the substrate comprises silicon. The discussion that follows illustrates embodiments of the dielectric film that can be formed according to the method 100 of FIG. 1.

Figure 2:
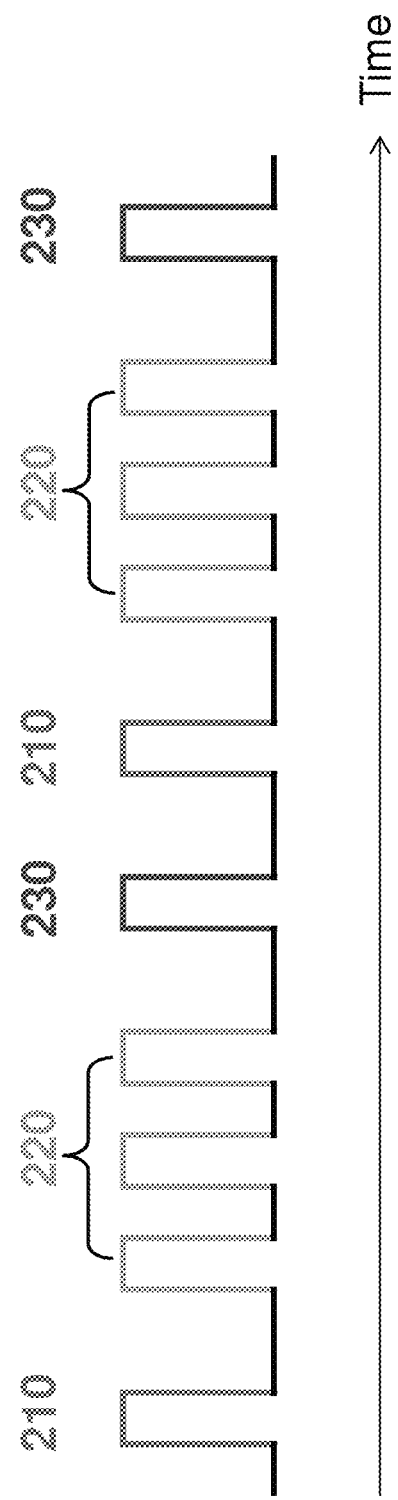
FIG. 2 is a gas flow diagram of a method of forming a dielectric film according to various aspects of the present disclosure.

FIG. 2 is a gas flow diagram of the method 100 of forming a dielectric film according to various aspects of the present disclosure. As depicted in FIG. 2 and step 110 in FIG. 1, the method 100 begins at step 110 by exposing a substrate to a first gas pulse 210 having a first oxygen-containing gas in a chamber. The first oxygen-containing gas comprises water ($H_2O$), hydrogen peroxide ($H_2O_2$), or a combination thereof. Exemplary pulse time of the first gas pulse 210 can be between 0.005 and 3 sec, for example 1 sec.

As depicted in FIG. 2 and step 120 in FIG. 1, the method 100 continues with step 120 by exposing the substrate to multiple consecutive second gas pulses 220 having a second oxygen-containing gas in the chamber, wherein the first oxygen-containing gas is different from the second oxygen-containing gas. The second oxygen-containing gas comprises ozone ($O_3$), oxygen gas ($O_2$), oxygen radicals (O), or a combination of two or more thereof. Ozone ($O_3$) may be generated by flowing oxygen gas ($O_2$) to a plasma system where the oxygen gas ($O_2$) is plasma excited to form ozone ($O_3$). The plasma system can, for example, contain a microwave frequency generator. Oxygen radicals (O) may be produced from oxygen gas ($O_2$) in the chamber as well. In some embodiments, the second oxygen-containing gas comprises a mixture of ozone ($O_3$) and oxygen gas ($O_2$), wherein a concentration ratio of ozone ($O_3$) to the mixture is about 6% to about 10%. In some embodiments, the concentration ratio is about 9% to about 10%. A high concentration ratio (e.g., over 10%) will cause an interfacial layer to regrow and reduce the device performance due to increased dielectric thickness. The multiple consecutive second gas pulses 220 have at least two consecutive second gas pulses. In some embodiments, the multiple consecutive second gas pulses 220 are three consecutive second gas pulses. Exemplary pulse time of one of the multiple consecutive second gas pulses 220 can be between 0.1 and 3 sec, for example 1 sec. In some embodiments, a pulse time of one of the multiple consecutive second gas pulses 220 is substantially equal to a pulse time of another one of the multiple consecutive second gas pulses 220. For example, the pulse time of one of the multiple consecutive second gas pulses 220 and that of another one of the multiple consecutive second gas pulses 220 are both 0.5 sec. In some embodiments, a pulse time of one of the multiple consecutive second gas pulses 220 is different from a pulse time of another one of the multiple consecutive second gas pulses 220. For example, the pulse time of one of the multiple consecutive second gas pulses 220 is 0.5 sec, and that of another one of the multiple consecutive second gas pulses 220 is 0.4 sec.

As depicted in FIG. 2 and step 130 in FIG. 1, the method 100 continues with step 130 by exposing the substrate to a third gas pulse 230 having a metal-containing gas in the chamber sequentially after steps 110 and 120. The metal-containing gas comprises one or more metal elements selected from Li, Be, Mg, Ca, Sr, Sc, Y, Ti, Zr, Hf, Al, La, Ce, Pr, Nd, Sm, Eu, Gd, Tb, Dy, Ho, Er, Tm, Yb, and Lu. The metal-containing gas may be a metal halide source chemical. In some embodiments, the metal-containing gas is $MZ_4$, wherein "M" is a metal, such as Ti, Zr, or Hf, and "Z" is selected from the group consisting of F, Cl, Br, I, and At. An example is $HfCl_4$. The metal-containing gas may be an organo-metal compound. In some embodiments, the metal-containing gas is trimethylaluminum, the chemical compound with the formula $Al_2(CH_3)_6$, abbreviated as $Al_2Me_6$, $(AlMe_3)_2$ or the abbreviation TMA. Exemplary pulse time of the third gas pulse 230 can be between 0.005 and 3 sec, for example 1 sec.

As depicted in FIG. 2 and steps 110, 120, and 130 in FIG. 1, in some embodiments, the multiple consecutive second gas pulses 220 are uninterrupted by the first gas pulse 210 or the third gas pulse 230. In some embodiments, a gas flow rate of the first gas pulse 210, a gas flow rate of each of the multiple consecutive second gas pulses 220, and a gas flow rate of the third gas pulse 230 are substantially equal. For example, the gas flow rate is 20 sccm (standard cubic centimeter per minute) with a carrier gas $N_2$. In some embodiments, a ratio of a pulse time of one of the multiple consecutive second gas pulses 220 to a pulse time of the first gas pulse 210 or the third gas pulse 230 is about 10 to about 100. In some embodiments, the ratio is about 25 to about 60. For example, the pulse time of the first gas pulse 210 is 0.015 sec, the pulse time of one of the multiple consecutive second gas pulses 220 is 0.5 sec, and the pulse time of the third gas pulse 230 is 0.015 sec.

As depicted in step 140 in FIG. 1, steps 110, 120, and 130 may be repeated any number of times to form the dielectric film with a predetermined thickness. For example, the predetermined thickness can be between about 5 angstrom (Å) and about 200 angstrom (Å), or between about 5 angstrom (Å) and about 30 angstrom (Å). The dielectric film is formed over the substrate by atomic layer deposition (ALD) or chemical vapor deposition (CVD). In some embodiments, the dielectric film has a dielectric constant ranging from about 5.8 to about 6.1. In some embodiments, the dielectric film has a leakage current ranging from about $1 \times 10^{-8}$ ampere/$cm^2$ to about $5 \times 10^{-8}$ ampere/$cm^2$ measured at a forward bias voltage minus 1 volt.

The method 100 further comprises purging and evacuating the chamber. The chamber is purged by a purge gas pulse comprising an inert gas, such as nitrogen ($N_2$), helium (He), neon (Ne), argon (Ar), krypton (Kr), xenon (Xe), or radon (Rn), and evacuated to remove unreacted first oxygen-containing gas, unreacted second oxygen-containing gas, unreacted metal-containing gas, and any byproducts from the chamber. The purge gas pulse is performed between each two consecutive gas pulses of the first gas pulse 210, the multiple consecutive second gas pulses 220, and the third gas pulse 230. Exemplary purge gas pulses can be between 1 and 20 sec, for example 3 sec. In some embodiments, a pulse time of the purge gas pulse is 5 sec.

A mechanism of the method 100 is described as follows. For example, the dielectric film is deposited by first contacting the substrate surface with the first oxygen-containing gas (e.g., $H_2O$) followed by contacting the substrate with the second oxygen-containing gas (e.g., $O_3$) to form initial OH surface terminations, followed by contacting the initial OH surface terminations with the metal-containing gas (e.g., $HfCl_4$) to form a metallic film on the substrate, the metallic film comprising metals with halogen ligands (e.g., Si—O—$HfCl_x$, where x can be 1, 2, or 3). Subsequently, contacting the metals with $H_2O$ followed by $O_3$ replaces the halogen ligands with OH ligands (e.g., Si—O—Hf(OH)$_x$). Next, $HfCl_4$ is contacted with the OH terminated metals to form halogen terminated metals covalently bonded to the oxygen (e.g., Si—O—Hf—O—$HfCl_x$). Subsequent exposure to $H_2O$ followed by $O_3$ replaces the halogen ligands with OH groups (e.g., Si—O—Hf—O—Hf(OH)$_x$). This process can be repeated any number of times to form the dielectric film with a predetermined thickness.

The methods of the present disclosure are not limited to the above-mentioned embodiment, and may have other different embodiments. For making it easier to compare the difference between the embodiments, the following description will detail the dissimilarities among different embodiments and the identical features will not be redundantly described.

Figure 3:
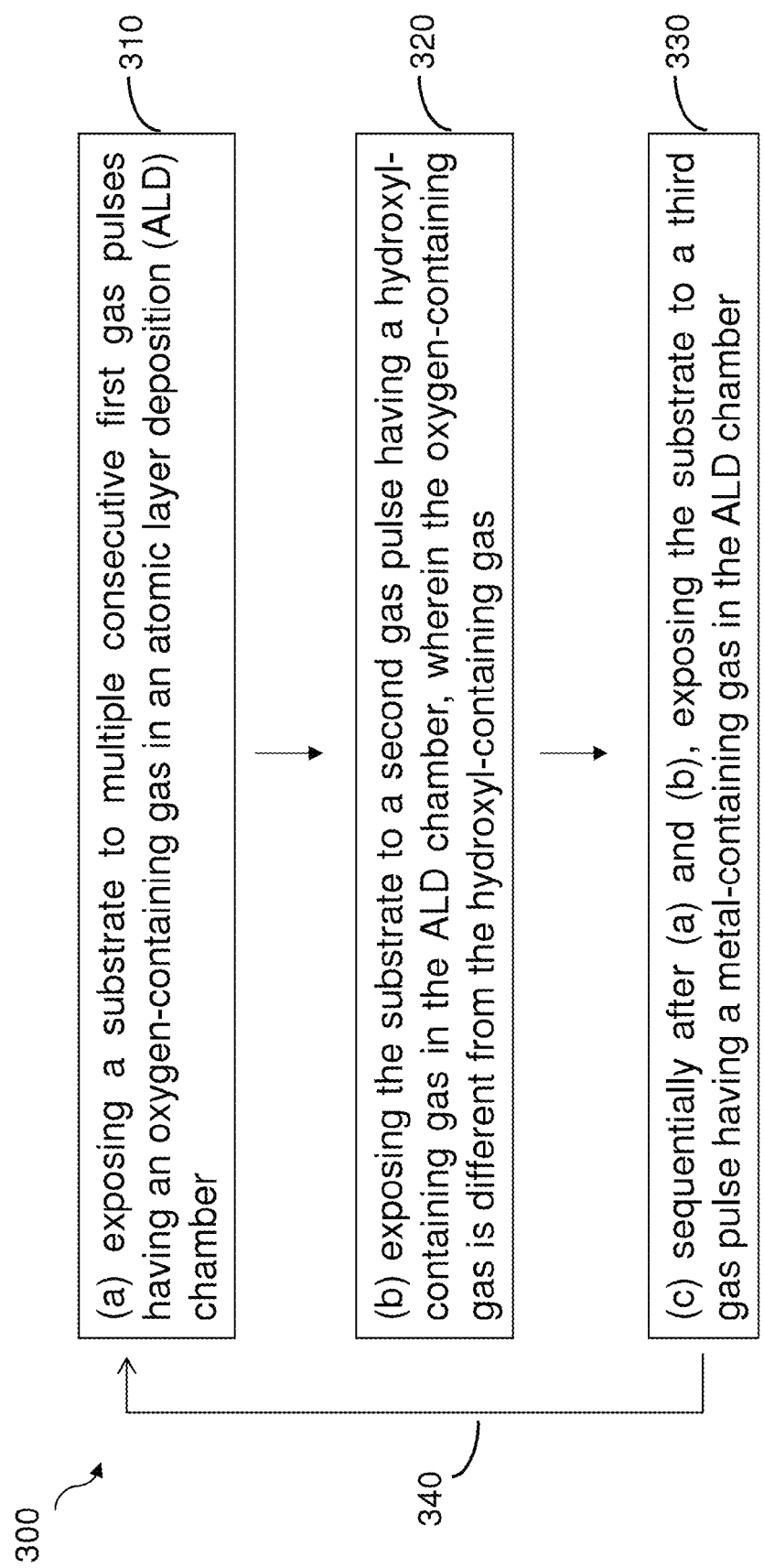
FIG. 3 is a process flow chart of a method of forming a high-k film according to various aspects of the present disclosure.

FIG. 3 is a process flow chart of a method 300 of forming a high-k film according to various aspects of the present disclosure. It is understood that additional steps can be provided before, during, and after the method 300, and some of the steps described can be replaced or eliminated for other embodiments of the method. The method 300 begins at step 310 in which a substrate is exposed to multiple consecutive first gas pulses having an oxygen-containing gas in an atomic layer deposition (ALD) chamber. The method 300 continues with step 320 in which the substrate is exposed to a second gas pulse having a hydroxyl-containing gas in the ALD chamber, wherein the oxygen-containing gas is different from the hydroxyl-containing gas. The method 300 continues with step 330 in which the substrate is exposed to a third gas pulse having a metal-containing gas in the ALD chamber sequentially after steps 310 and 320. Steps 310, 320, and 330 may be repeated any number of times, as shown by step 340, to form the high-k film with a predetermined thickness. For example, the predetermined thickness can be between about 5 angstrom (Å) and about 200 angstrom (Å), or between about 5 angstrom (Å) and about 30 angstrom (Å). The discussion that follows illustrates embodiments of the high-k film that can be formed according to the method 300 of FIG. 3.

Figure 4:
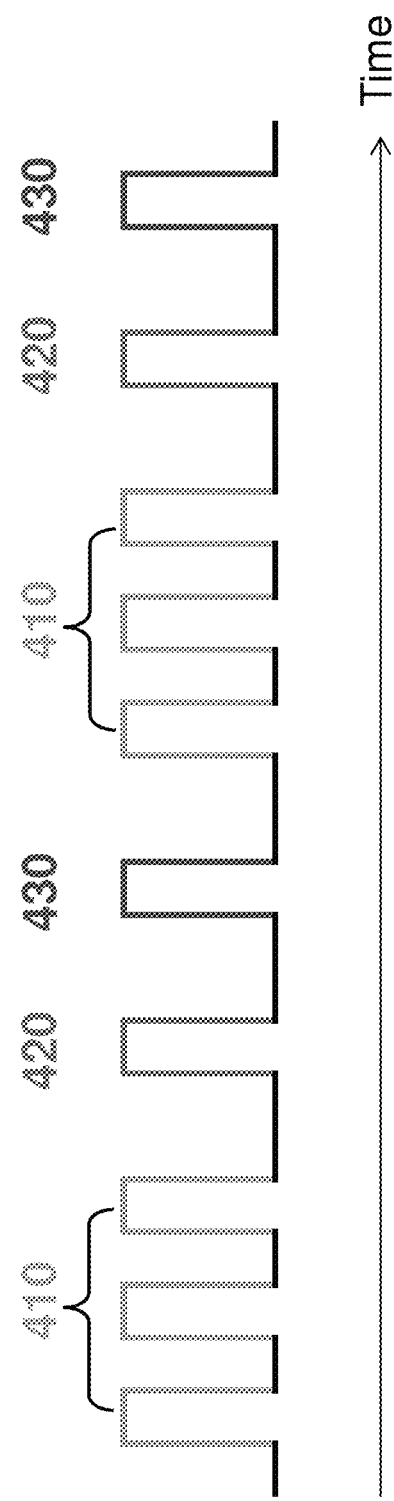
FIG. 4 is a gas flow diagram of a method of forming a high-k film according to various aspects of the present disclosure.

FIG. 4 is a gas flow diagram of the method 300 of forming a high-k film according to various aspects of the present disclosure. As depicted in FIG. 4 and step 310 in FIG. 3, the method 300 begins at step 310 by exposing a substrate to multiple consecutive first gas pulses 410 having an oxygen-containing gas in an atomic layer deposition (ALD) chamber. The oxygen-containing gas comprises ozone ($O_3$), oxygen gas ($O_2$), oxygen radicals (O), or a combination of two or more thereof. Ozone ($O_3$) may be generated by flowing oxygen gas ($O_2$) to a plasma system where the oxygen gas ($O_2$) is plasma excited to form ozone ($O_3$). The plasma system can, for example, contain a microwave frequency generator. Oxygen radicals (O) may be produced from oxygen gas ($O_2$) in the chamber as well. In some embodiments, the oxygen-containing gas comprises a mixture of ozone ($O_3$) and oxygen gas ($O_2$), wherein a concentration ratio of ozone ($O_3$) to the mixture is about 6% to about 10%. In some embodiments, the concentration ratio is about 9% to about 10%. A high concentration ratio (e.g., over 10%) will cause an interfacial layer to regrow and reduce the device performance due to increased dielectric thickness. The multiple consecutive first gas pulses 410 have at least two consecutive first gas pulses. In some embodiments, the multiple consecutive first gas pulses 410 are three consecutive first gas pulses. Exemplary pulse time of one of the multiple consecutive first gas pulses 410 can be between 0.1 and 3 sec, for example 1 sec. In some embodiments, a pulse time of one of the multiple consecutive first gas pulses 410 is substantially equal to a pulse time of another one of the multiple consecutive first gas pulses 410. For example, the pulse time of one of the multiple consecutive first gas pulses 410 and that of another one of the multiple consecutive first gas pulses 410 are both 0.5 sec. In some embodiments, a pulse time of one of the multiple consecutive first gas pulses 410 is different from a pulse time of another one of the multiple consecutive first gas pulses 410. For example, the pulse time of one of the multiple consecutive first gas pulses 410 is 0.5 sec, and that of another one of the multiple consecutive first gas pulses 410 is 0.4 sec.

As depicted in FIG. 4 and step 320 in FIG. 3, the method 300 continues with step 320 by exposing the substrate to a second gas pulse 420 having a hydroxyl-containing gas in the ALD chamber, wherein the oxygen-containing gas is different from the hydroxyl-containing gas. The hydroxyl-containing gas comprises water ($H_2O$), hydrogen peroxide ($H_2O_2$), or a combination thereof. Exemplary pulse time of the second gas pulse 420 can be between 0.005 and 3 sec, for example 1 sec.

As depicted in FIG. 4 and step 330 in FIG. 3, the method 300 continues with step 330 by exposing the substrate to a third gas pulse 430 having a metal-containing gas in the ALD chamber sequentially after steps 310 and 320. The metal-containing gas comprises one or more metal elements selected from Li, Be, Mg, Ca, Sr, Sc, Y, Ti, Zr, Hf, Al, La, Ce, Pr, Nd, Sm, Eu, Gd, Tb, Dy, Ho, Er, Tm, Yb, and Lu. The metal-containing gas may be a metal halide source chemical. In some embodiments, the metal-containing gas is MZ4, wherein "M" is a metal, such as Ti, Zr, or Hf, and "Z" is selected from the group consisting of F, Cl, Br, I, and At. An example is HfCl4. The metal-containing gas may be an organo-metal compound. In some embodiments, the metal-containing gas is trimethylaluminum, the chemical compound with the formula Al2(CH3)6, abbreviated as Al2Me6, (AlMe3)2 or the abbreviation TMA. Exemplary pulse time of the third gas pulse 430 can be between 0.005 and 3 sec, for example 1 sec.

As depicted in FIG. 4 and steps 310, 320, and 330 in FIG. 3, in some embodiments, the multiple consecutive first gas pulses 410 are uninterrupted by the second gas pulse 420 or the third gas pulse 430. In some embodiments, a gas flow rate of each of the multiple consecutive first gas pulses 410, a gas flow rate of the second gas pulse 420, and a gas flow rate of the third gas pulse 430 are substantially equal. For example, the gas flow rate is 20 sccm (standard cubic centimeter per minute) with a carrier gas $N_2$. In some embodiments, a ratio of a pulse time of one of the multiple consecutive first gas pulses 410 to a pulse time of the second gas pulse 420 or the third gas pulse 430 is about 10 to about 100. In some embodiments, the ratio is about 25 to about 60. For example, the pulse time of one of the multiple consecutive first gas pulses 410 is 0.5 sec, the pulse time of the second gas pulse 420 is 0.015 sec, and the pulse time of the third gas pulse 430 is 0.015 sec.

As depicted in step 340 in FIG. 3, steps 310, 320, and 330 may be repeated any number of times to form the high-k film with a predetermined thickness. For example, the predetermined thickness can be between about 5 angstrom (Å) and about 200 angstrom (Å), or between about 5 angstrom (Å) and about 30 angstrom (Å). The high-k film is formed over the substrate by atomic layer deposition (ALD). In some embodiments, the high-k film has a dielectric constant ranging from about 5.8 to about 6.1. In some embodiments, the high-k film has a leakage current ranging from about $1\times10^{-8}$ ampere/cm$^2$ to about $5\times10^{-8}$ ampere/cm$^2$ measured at a forward bias voltage minus 1 volt.

The method 300 further comprises purging and evacuating the chamber. The chamber is purged by a purge gas pulse comprising an inert gas, such as nitrogen ($N_2$), helium (He), neon (Ne), argon (Ar), krypton (Kr), xenon (Xe), or radon (Rn), and evacuated to remove unreacted oxygen-containing gas, unreacted hydroxyl-containing gas, unreacted metal-containing gas, and any byproducts from the chamber. The purge gas pulse is performed between each two consecutive gas pulses of the multiple consecutive first gas pulses 410, the second gas pulse 420, and the third gas pulse 430. Exemplary purge gas pulses can be between 1 and 20 sec, for example 3 sec. In some embodiments, a pulse time of the purge gas pulse is 5 sec.

A mechanism of the method 300 is described as follows. For example, the high-k film is deposited by first contacting the substrate surface with the oxygen-containing gas (e.g., $O_3$) followed by contacting the substrate with the hydroxyl-containing gas (e.g., $H_2O$) to form initial OH surface terminations, followed by contacting the initial OH surface terminations with the metal-containing gas (e.g., $HfCl_4$) to form a metallic film on the substrate, the metallic film comprising metals with halogen ligands (e.g., Si—O—$HfCl_x$, where x can be 1, 2, or 3). Subsequently, contacting the metals with $O_3$ followed by $H_2O$ replaces the halogen ligands with OH ligands (e.g., Si—O—$Hf(OH)_x$). Next, $HfCl_4$ is contacted with the OH terminated metals to form halogen terminated metals covalently bonded to the oxygen (e.g., Si—O—Hf—O—$HfCl_x$). Subsequent exposure to $O_3$ followed by $H_2O$ replaces the halogen ligands with OH groups (e.g., Si—O—Hf—O—$Hf(OH)_x$). This process can be repeated any number of times to form the high-k film with a predetermined thickness.

Figure 5:
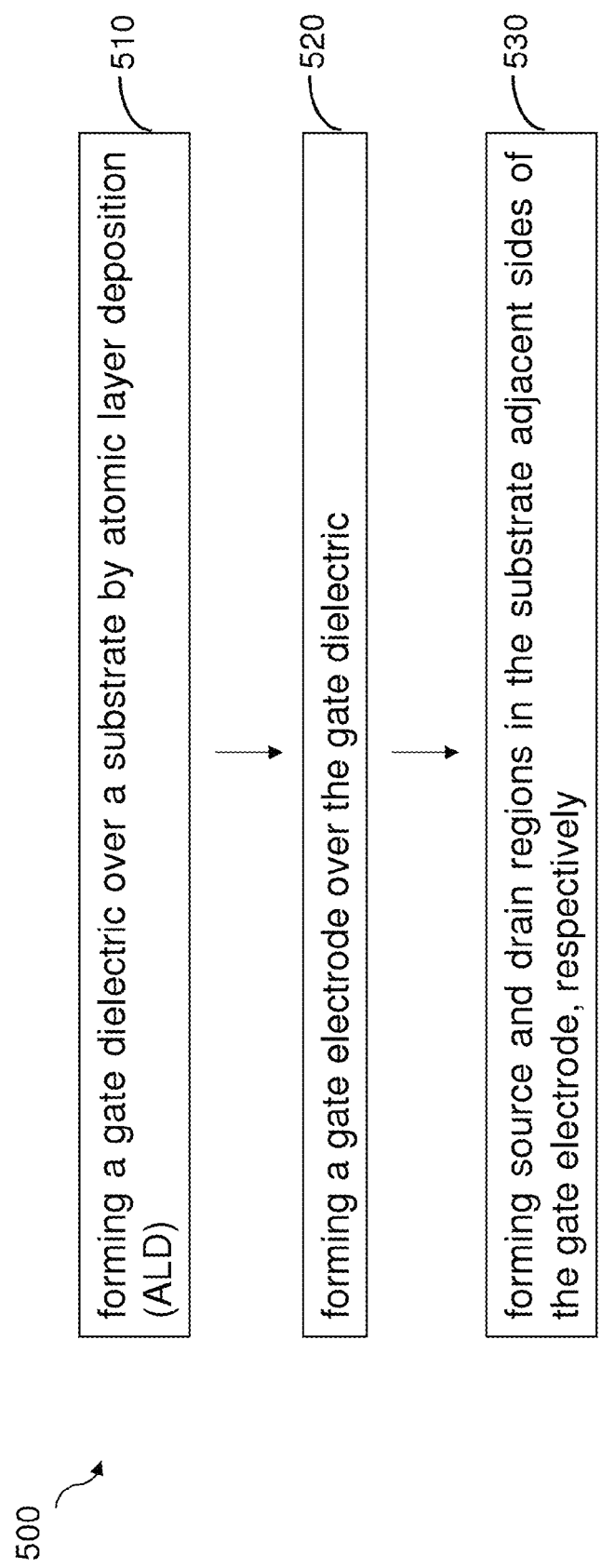
FIG. 5 is a process flow chart of a method of forming a semiconductor device according to various aspects of the present disclosure.

FIG. 5 is a process flow chart of a method 500 of forming a semiconductor device according to various aspects of the present disclosure. It is understood that additional steps can be provided before, during, and after the method 500, and some of the steps described can be replaced or eliminated for other embodiments of the method. The method 500 begins at step 510 in which a gate dielectric is formed over a substrate by atomic layer deposition (ALD). The method 500 continues with step 520 in which a gate electrode is formed over the gate dielectric. The method 500 continues with step 530 in which source and drain regions in the substrate are formed adjacent sides of the gate electrode, respectively. The discussion that follows illustrates embodiments of the semiconductor device that can be formed according to the method 500 of FIG. 5.

Figure 6:
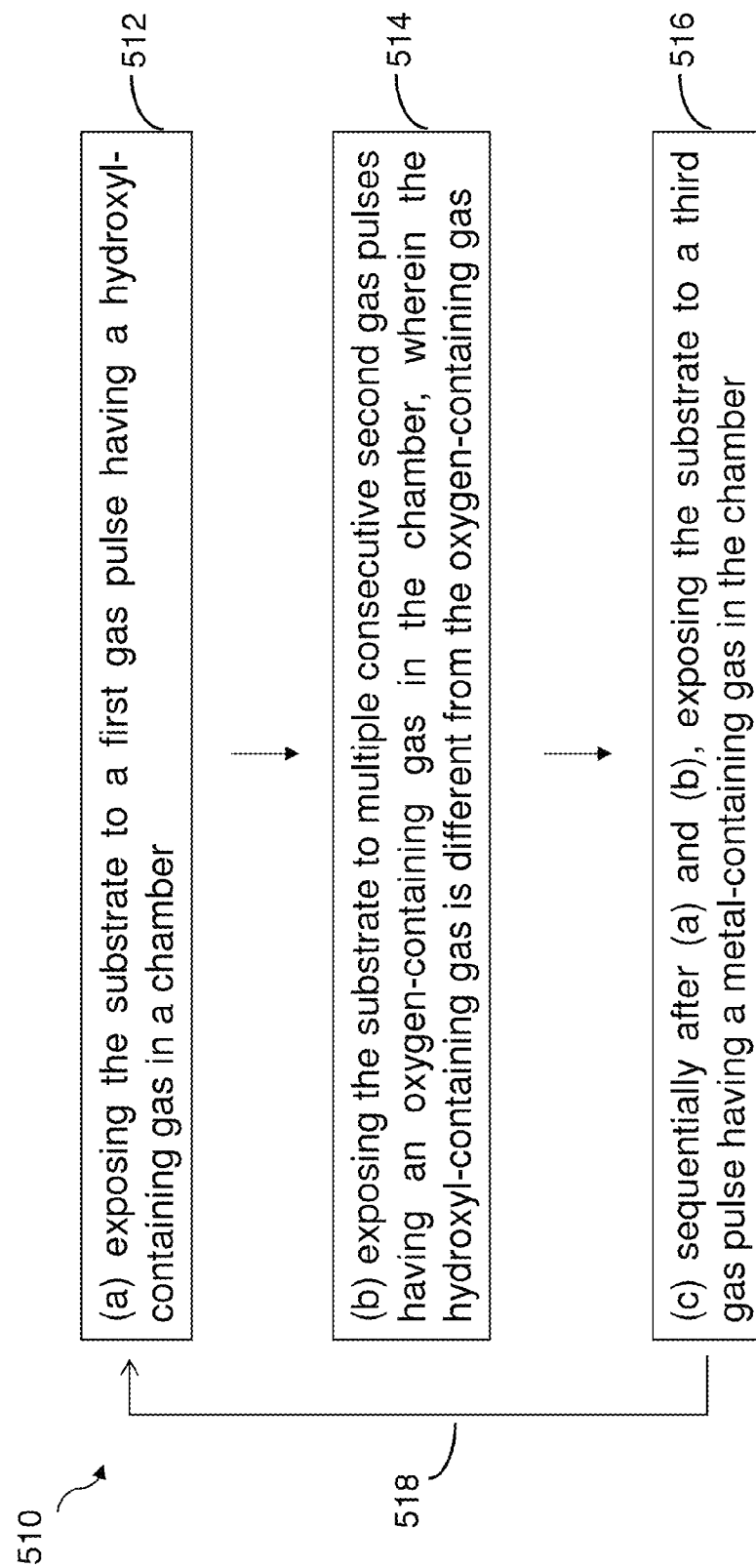
FIG. 6 shows the detail of sub-steps 512, 514, 516, and 518 of step 510 in FIG. 5.

Step 510 comprises several sub-steps. FIG. 6 shows the detail of sub-steps 512, 514, 516, and 518 of step 510 in FIG. 5. Step 510 begins at sub-step 512 in which the substrate is exposed to a first gas pulse having a hydroxyl-containing gas in a chamber. Step 510 continues with sub-step 514 in which the substrate is exposed to multiple consecutive second gas pulses having an oxygen-containing gas in the chamber, wherein the hydroxyl-containing gas is different from the oxygen-containing gas. Step 510 continues with sub-step 516 in which the substrate is exposed to a third gas pulse having a metal-containing gas in the chamber sequentially after sub-steps 512 and 514. Sub-steps 512, 514, and 516 may be repeated any number of times, as shown by sub-step 518, to form the gate dielectric with a predetermined thickness. For example, the predetermined thickness can be between about 5 angstrom (Å) and about 200 angstrom (Å), or between about 5 angstrom (Å) and about 30 angstrom (Å). The discussion that follows also illustrates embodiments of the gate dielectric that can be formed according to step 510 of FIG. 6.

As depicted in step 510 in FIG. 5, the method 500 begins at step 510 by forming a gate dielectric over a substrate by atomic layer deposition (ALD). Step 510 comprises several sub-steps 512, 514, 516, and 518, as shown in FIG. 6.

Figure 7:
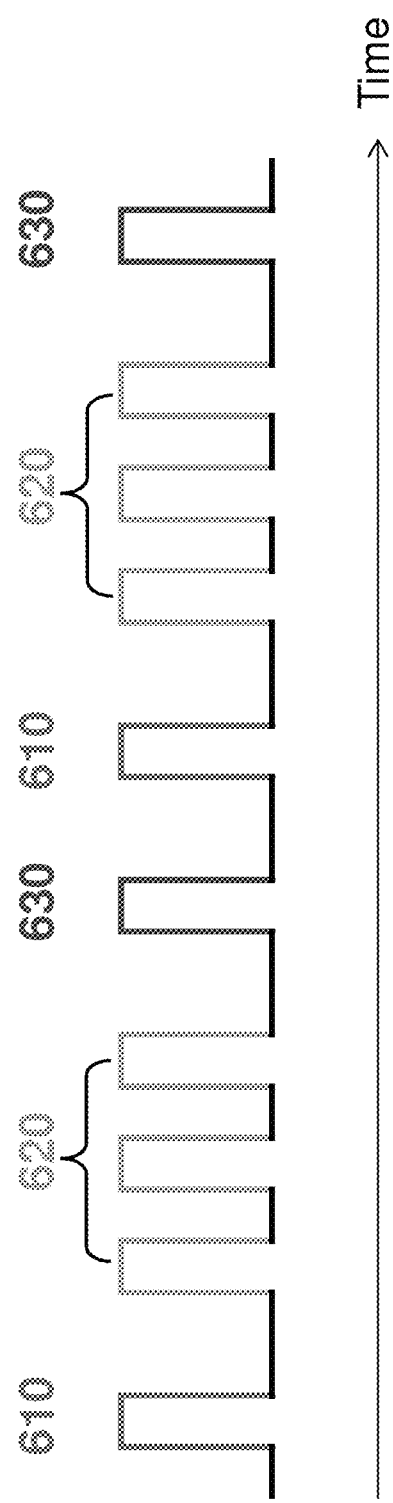
FIG. 7 is a gas flow diagram of step 510 of forming a gate dielectric according to various aspects of the present disclosure.

FIG. 7 is a gas flow diagram of step 510 of forming a gate dielectric according to various aspects of the present disclosure. As depicted in FIG. 7 and sub-step 512 in FIG. 6, step 510 begins at sub-step 512 by exposing the substrate to a first gas pulse 610 having a hydroxyl-containing gas in a chamber. The hydroxyl-containing gas comprises water ($H_2O$), hydrogen peroxide ($H_2O_2$), or a combination thereof. Exemplary pulse time of the first gas pulse 610 can be between 0.005 and 3 sec, for example 1 sec.

As depicted in FIG. 7 and sub-step 514 in FIG. 6, step 510 continues with sub-step 514 by exposing the substrate to multiple consecutive second gas pulses 620 having an oxygen-containing gas in the chamber, wherein the hydroxyl-containing gas is different from the oxygen-containing gas. The oxygen-containing gas comprises ozone ($O_3$), oxygen gas ($O_2$), oxygen radicals (O), or a combination of two or more thereof. Ozone ($O_3$) may be generated by flowing oxygen gas ($O_2$) to a plasma system where the oxygen gas ($O_2$) is plasma excited to form ozone ($O_3$). The plasma system can, for example, contain a microwave frequency generator. Oxygen radicals (O) may be produced from oxygen gas ($O_2$) in the chamber as well. In some embodiments, the oxygen-containing gas comprises a mixture of ozone ($O_3$) and oxygen gas ($O_2$), wherein a concentration ratio of ozone ($O_3$) to the mixture is about 6% to about 10%. In some embodiments, the concentration ratio is about 9% to about 10%. A high concentration ratio (e.g., over 10%) will cause an interfacial layer to regrow and reduce the device performance due to increased dielectric thickness. The multiple consecutive second gas pulses 620 have at least two consecutive second gas pulses. In some embodiments, the multiple consecutive second gas pulses 620 are three consecutive second gas pulses. Exemplary pulse time of one of the multiple consecutive second gas pulses 620 can be between 0.1 and 3 sec, for example 1 sec. In some embodiments, a pulse time of one of the multiple consecutive second gas pulses 620 is substantially equal to a pulse time of another one of the multiple consecutive second gas pulses 620. For example, the pulse time of one of the multiple consecutive second gas pulses 620 and that of another one of the multiple consecutive second gas pulses 620 are both 0.5 sec. In some embodiments, a pulse time of one of the multiple consecutive second gas pulses 620 is different from a pulse time of another one of the multiple consecutive second gas pulses 620. For example, the pulse time of one of the multiple consecutive second gas pulses 620 is 0.5 sec, and that of another one of the multiple consecutive second gas pulses 620 is 0.4 sec.

As depicted in FIG. 7 and sub-step 516 in FIG. 6, step 510 continues with sub-step 516 by exposing the substrate to a third gas pulse 630 having a metal-containing gas in the chamber sequentially after sub-steps 512 and 514. The metal-containing gas comprises one or more metal elements selected from Li, Be, Mg, Ca, Sr, Sc, Y, Ti, Zr, Hf, Al, La, Ce, Pr, Nd, Sm, Eu, Gd, Tb, Dy, Ho, Er, Tm, Yb, and Lu. The metal-containing gas may be a metal halide source chemical. In some embodiments, the metal-containing gas is $MZ_4$, wherein "M" is a metal, such as Ti, Zr, or Hf, and "Z" is selected from the group consisting of F, Cl, Br, I, and At. An example is $HfCl_4$. The metal-containing gas may be an organo-metal compound. In some embodiments, the metal-containing gas is trimethylaluminum, the chemical compound with the formula $Al_2(CH_3)_6$, abbreviated as $Al_2Me_6$, $(AlMe_3)_2$ or the abbreviation TMA. Exemplary pulse time of the third gas pulse 230 can be between 0.005 and 3 sec, for example 1 sec.

As depicted in FIG. 7 and sub-steps 512, 514, and 516 in FIG. 6, in some embodiments, the multiple consecutive second gas pulses 620 are uninterrupted by the first gas pulse 610 or the third gas pulse 630. In some embodiments, a gas flow rate of the first gas pulse 610, a gas flow rate of each of the multiple consecutive second gas pulses 620, and a gas flow rate of the third gas pulse 630 are substantially equal. For example, the gas flow rate is 20 sccm (standard cubic centimeter per minute) with a carrier gas $N_2$. In some embodiments, a ratio of a pulse time of one of the multiple consecutive second gas pulses 620 to a pulse time of the first gas pulse 610 or the third gas pulse 630 is about 10 to about 100. In some embodiments, the ratio is about 25 to about 60. For example, the pulse time of the first gas pulse 610 is 0.015 sec, the pulse time of one of the multiple consecutive second gas pulses 620 is 0.5 sec, and the pulse time of the third gas pulse 630 is 0.015 sec.

As depicted in sub-step 518 in FIG. 6, sub-steps 512, 514, and 516 may be repeated any number of times to form the gate dielectric with a predetermined thickness. For example, the predetermined thickness can be between about 5 angstrom (Å) and about 200 angstrom (Å), or between about 5 angstrom (Å) and about 30 angstrom (Å). The gate dielectric is formed over the substrate by atomic layer deposition (ALD). In some embodiments, the gate dielectric has a dielectric constant ranging from about 5.8 to about 6.1. In some embodiments, the gate dielectric has a leakage current ranging from about $1 \times 10^{-8}$ ampere/$cm^2$ to about $5 \times 10^{-8}$ ampere/$cm^2$ measured at a forward bias voltage minus 1 volt.

Step 510 further comprises purging and evacuating the chamber. The chamber is purged by a purge gas pulse comprising an inert gas, such as nitrogen ($N_2$), helium (He), neon (Ne), argon (Ar), krypton (Kr), xenon (Xe), or radon (Rn), and evacuated to remove unreacted hydroxyl-containing gas, unreacted oxygen-containing gas, unreacted metal-containing gas, and any byproducts from the chamber. The purge gas pulse is performed between each two consecutive gas pulses of the first gas pulse 610, the multiple consecutive second gas pulses 620, and the third gas pulse 630. Exemplary purge gas pulses can be between 1 and 20 sec, for example 3 sec. In some embodiments, a pulse time of the purge gas pulse is 5 sec.

A mechanism of step 510 is described as follows. For example, the gate dielectric is deposited by first contacting the substrate surface with the hydroxyl-containing gas (e.g., $H_2O$) followed by contacting the substrate with the oxygen-containing gas (e.g., $O_3$) to form initial OH surface terminations, followed by contacting the initial OH surface terminations with the metal-containing gas (e.g., $HfCl_4$) to form a metallic film on the substrate, the metallic film comprising metals with halogen ligands (e.g., Si—O—$HfCl_x$, where x can be 1, 2, or 3). Subsequently, contacting the metals with $H_2O$ followed by $O_3$ replaces the halogen ligands with OH ligands (e.g., Si—O—$Hf(OH)_x$). Next, $HfCl_4$ is contacted with the OH terminated metals to form halogen terminated metals covalently bonded to the oxygen (e.g., Si—O—Hf—O—$HfCl_x$). Subsequent exposure to $H_2O$ followed by $O_3$ replaces the halogen ligands with OH groups (e.g., Si—O—Hf—O—$Hf(OH)_x$). This process can be repeated any number of times to form the gate dielectric with a predetermined thickness.

As depicted in step 520 in FIG. 5, the method 500 continues with step 520 by forming a gate electrode over the gate dielectric. In some embodiments, the gate electrode may comprise a single-layer or multilayer structure. In one embodiment, the gate electrode comprises poly-silicon. Further, the gate electrode may be doped poly-silicon with the uniform or non-uniform doping. In an alternative embodiment, the gate electrode comprises a metal selected from a group of W, Cu, Ti, Ag, Al, TiAl, TiAlN, TaC, TaCN, TaSiN, Mn, and Zr. In an alternative embodiment, the gate electrode comprises a metal selected from a group of TiN, WN, TaN, and Ru. In an alternative embodiment, the gate electrode comprises a thickness in the range of about 30 nm to about 60 nm. The gate electrode may be formed using a suitable process such as ALD, CVD, PVD, plating, or combinations thereof.

As depicted in step 530 in FIG. 5, the method 500 continues with step 530 by forming source and drain regions in the substrate adjacent sides of the gate electrode, respectively. In an embodiment, source and drain regions are formed in the active regions of the substrate associated with the gate dielectric and the gate electrode. The source and drain regions may include the introduction of suitable dopant types: n-type or p-type dopants. The source and drain regions may include halo or low-dose drain (LDD) implantation, source and drain implantation, source and drain activation (e.g., anneal), and/or other suitable processes. In other embodiments, the source and drain regions may include raised source and drain regions, strained regions, epitaxially-grown regions, and/or other suitable techniques. In an embodiment, the method 500 includes the silicidation of doped source and drain regions. The silicide materials may include nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. The silicide features can be formed by a process that includes depositing a metal layer, annealing the metal layer such that the metal layer is able to react with silicon to form silicide, and then removing the non-reacted metal layer.

The methods of the present disclosure are not limited to be used by a planar device on the substrate and can be applied to a non-planar device as well, such as a fin-like field effect transistor (FinFET). Based on the discussions above, it can be seen that by using the methods of the present disclosure, the quality of the dielectric film is enhanced. For example, the dielectric film has a dielectric constant ranging from about 5.8 to about 6.1, and has a leakage current ranging from about $1 \times 10^{-8}$ ampere/$cm^2$ to about $5 \times 10^{-8}$ ampere/$cm^2$ measured at a forward bias voltage minus 1 volt. As a result, the dielectric constant and the leakage current of the dielectric film can be improved by using the methods of the present disclosure.

One of the broader forms of the present disclosure involves a method of forming a dielectric film. The method comprises (a) exposing a substrate to a first gas pulse having a first oxygen-containing gas in a chamber; (b) exposing the substrate to multiple consecutive second gas pulses having a second oxygen-containing gas in the chamber, wherein the first oxygen-containing gas is different from the second oxygen-containing gas; and (c) sequentially after (a) and (b), exposing the substrate to a third gas pulse having a metal-containing gas in the chamber.

Another of the broader forms of the present disclosure involves a method of forming a high-k film. The device comprises a method of forming a high-k film. The method comprises (a) exposing a substrate to multiple consecutive first gas pulses having an oxygen-containing gas in an atomic layer deposition (ALD) chamber; (b) exposing the substrate to a second gas pulse having a hydroxyl-containing gas in the ALD chamber, wherein the oxygen-containing gas is different from the hydroxyl-containing gas; and (c) sequentially after (a) and (b), exposing the substrate to a third gas pulse having a metal-containing gas in the ALD chamber.

Still another of the broader forms of the present disclosure involves a method of forming a semiconductor device. The method comprises forming a gate dielectric over a substrate by atomic layer deposition (ALD); forming a gate electrode over the gate dielectric; and forming source and drain regions in the substrate adjacent sides of the gate electrode, respectively; wherein the forming the gate dielectric comprises (a) exposing the substrate to a first gas pulse having a hydroxyl-containing gas in a chamber; (b) exposing the substrate to multiple consecutive second gas pulses having an oxygen-containing gas in the chamber, wherein the hydroxyl-containing gas is different from the oxygen-containing gas; and (c) sequentially after (a) and (b), exposing the substrate to a third gas pulse having a metal-containing gas in the chamber.

The foregoing has outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of forming a dielectric film, comprising:
   (a) exposing a substrate to a first gas pulse having a first oxygen-containing gas in a chamber;
   (b) sequentially after step (a), exposing the substrate to multiple consecutive second gas pulses having a second oxygen-containing gas in the chamber, wherein the first oxygen-containing gas is different from the second oxygen-containing gas, wherein a pulse time of one of the multiple consecutive second gas pulses is different from a pulse time of another one of the multiple consecutive second gas pulses; and
   (c) sequentially after (a) and (b), exposing the substrate to a third gas pulse having a metal-containing gas in the chamber.

2. The method of claim 1, wherein the first oxygen-containing gas comprises water ($H_2O$), hydrogen peroxide ($H_2O_2$), or a combination thereof.

3. The method of claim 1, wherein the second oxygen-containing gas comprises ozone ($O_3$), oxygen gas ($O_2$), oxygen radicals (O), or a combination of two or more thereof.

4. The method of claim 1, wherein the second oxygen-containing gas comprises a mixture of ozone ($O_3$) and oxygen gas ($O_2$), wherein a concentration ratio of ozone ($O_3$) to the mixture is about 9% to about 10%.

5. The method of claim 1, wherein the multiple consecutive second gas pulses are uninterrupted by the first gas pulse or the third gas pulse.

6. The method of claim 1, wherein the multiple consecutive second gas pulses are three consecutive second gas pulses.

7. The method of claim 1, wherein a gas flow rate of the first gas pulse, a gas flow rate of each of the multiple consecutive second gas pulses, and a gas flow rate of the third gas pulse are substantially equal.

8. The method of claim 1, wherein a pulse time of one of the multiple consecutive second gas pulses is substantially equal to a pulse time of another one of the multiple consecutive second gas pulses.

9. The method of claim 1, wherein a ratio of a pulse time of one of the multiple consecutive second gas pulses to a pulse time of the first gas pulse or the third gas pulse is about 10 to about 100.

10. The method of claim 1, wherein the metal-containing gas comprises one or more metal elements selected from the group consisting of Li, Be, Mg, Ca, Sr, Sc, Y, Ti, Zr, Hf, Al, La, Ce, Pr, Nd, Sm, Eu, Gd, Tb, Dy, Ho, Er, Tm, Yb, and Lu.

11. The method of claim 1, wherein the dielectric film is formed over the substrate by atomic layer deposition (ALD) or chemical vapor deposition (CVD).

12. The method of claim 1, wherein the dielectric film has a dielectric constant ranging from about 5.8 to about 6.1.

13. A method of forming a high-k film, comprising:
   (a) exposing a substrate to multiple consecutive first gas pulses having an oxygen-containing gas in an atomic layer deposition (ALD) chamber, wherein a first one of the multiple consecutive first gas pulses is pulsed for a first time period and a second one of the multiple consecutive first gas pulses is pulsed for a second time period different from the first time period;
   (b) sequentially after step (a), exposing the substrate to a second gas pulse having a hydroxyl-containing gas in the ALD chamber, wherein the oxygen-containing gas is different from the hydroxyl-containing gas; and
   (c) sequentially after (a) and (b), exposing the substrate to a third gas pulse having a metal-containing gas in the ALD chamber.

14. The method of claim 13, wherein the oxygen-containing gas comprises a mixture of ozone ($O_3$) and oxygen gas ($O_2$), wherein a concentration ratio of ozone ($O_3$) to the mixture is about 9% to about 10%.

15. The method of claim 13, wherein the hydroxyl-containing gas comprises water ($H_2O$), hydrogen peroxide ($H_2O_2$), or a combination thereof.

16. The method of claim 13, wherein the multiple consecutive first gas pulses are uninterrupted by the second gas pulse or the third gas pulse.

17. The method of claim 13, wherein the multiple consecutive first gas pulses are three consecutive first gas pulses.

18. The method of claim 13, wherein the high-k film has a dielectric constant ranging from about 5.8 to about 6.1.

19. A method of forming a semiconductor device, comprising:
   forming a gate dielectric over a substrate by atomic layer deposition (ALD);
   forming a gate electrode over the gate dielectric; and
   forming source and drain regions in the substrate adjacent sides of the gate electrode, respectively;
   wherein the forming the gate dielectric comprises:
   (a) exposing the substrate to a first gas pulse having a hydroxyl-containing gas in a chamber;
   (b) sequentially after step (a), exposing the substrate to multiple consecutive second gas pulses having an oxygen-containing gas in the chamber, wherein the hydroxyl-containing gas is different from the oxygen-containing gas, wherein a first one of the multiple consecutive second gas pulses has a different time than a second one of the multiple consecutive second gas pulses; and (c) sequentially after (a) and (b), exposing the substrate to a third gas pulse having a metal-containing gas in the chamber.

20. The method of claim 19, wherein the first one of the multiple consecutive second gas pulses has a first flow rate and the second one of the multiple consecutive second gas pulses has the first flow rate.

\* \* \* \* \*